United States Patent [19]

Takishima

[11] Patent Number: 4,699,682
[45] Date of Patent: Oct. 13, 1987

[54] SURFACE ACOUSTIC WAVE DEVICE SEALING METHOD

[75] Inventor: Shoji Takishima, Tokyo, Japan
[73] Assignee: Clarion Co., Ltd., Tokyo, Japan
[21] Appl. No.: 919,904
[22] Filed: Oct. 16, 1986
[30] Foreign Application Priority Data Oct. 23, 1985 [JP] Japan .................................. 60-238250

[51] Int. Cl.⁴ .............................................. B32B 31/12
[52] U.S. Cl. ...................................... 156/292; 29/594; 310/313 R; 310/313 B; 310/313 C; 333/150; 333/154
[58] Field of Search ....................... 156/242, 290, 292; 29/594; 310/311, 313 R, 313 B, 313 C, 322, 325, 334, 340, 363, 364, 367, 368, 369, 370; 333/150, 154

[56] References Cited

U.S. PATENT DOCUMENTS

| | | | |
|---|---|---|---|
| 4,047,129 | 9/1977 | Ishiyama | 310/313 B |
| 4,213,104 | 7/1980 | Cullen et al. | 333/150 |
| 4,291,285 | 9/1981 | Kadota | 310/313 R |
| 4,296,347 | 10/1981 | Weirauch | 310/313 R |
| 4,306,456 | 12/1981 | Maerfeld | 310/313 R |

FOREIGN PATENT DOCUMENTS

| | | | |
|---|---|---|---|
| 0016147 | 2/1977 | Japan | 333/150 |
| 0094814 | 7/1981 | Japan | 333/154 |
| 1389610 | 4/1975 | United Kingdom | 333/150 |

Primary Examiner—Caleb Weston
Attorney, Agent, or Firm—Flynn, Thiel, Boutell & Tanis

[57] ABSTRACT

A surface acoustic wave device sealing method prepares a cavity-defining member and lead members for electrical connection. A surface acoustic wave element having a wave propagation surface and electrodes is bonded to the cavity member by an adhesive applied to the circumferential edge of the cavity so that the propagation surface is opposed to the interior of the cavity, and the electrodes are exposed to the exterior of the cavity member. The electrodes are connected to the lead members, and the resulting unitary body is sealed by a mass of resin.

1 Claim, 8 Drawing Figures

SURFACE ACOUSTIC WAVE DEVICE SEALING METHOD

FIELD OF THE INVENTION

This invention relates to a sealing method for sealing a surface acoustic wave device in particular for civilian-use electrical equipments.

BACKGROUND OF THE INVENTION

Foreign matters if present on the wave propagation surface of a surface acoustic wave device undoubtedly influence the wave propagation and damage the expected characteristic of the device. To avoid this, the greatest attention has to be paid to protection of the wave propagation surface against contamination in its manufacturing process. In this connection, the prior art technology employs a hermetic seal using a metal or ceramic cavity member to provide a space-keeping covering of the wave propagation surface of a surface acoustic wave device.

FIG. 4 is a cross-sectional view of one form of the prior art hermetic can package in which a chip 1 is bonded to one surface of a stem 4 by an adhesive 6, and is connected to terminal pins 5 by bonding wires 3. The surface of the stem 4 including the chip 1, bonding wires 3 and terminal pins 5 is covered by a cap 2 which defines a sealed interior space above the upper surface of the chip 1.

The prior art sealing method, however, is somewhat expensive. Therefore, there is a great demand for an inexpensive, mass-productive sealing method in particular for surface acoustic wave devices for civilian-use equipments.

OBJECT OF THE INVENTION

It is therefore an object of the invention to provide an inexpensive surface acoustic wave device sealing method which reliably protects the wave propagation surface of a surface acoustic wave device against contamination which would otherwise damage the characteristic of the device.

SUMMARY OF THE INVENTION

According to the most basic feature of the invention, a surface acoustic wave device sealing method comprises: a step of preparing a cavity member defining a widely opening cavity, a step of bonding a surface acoustic wave element to the cavity member so that the wave propagation surface of the element is spaced from and opposed to the inner surface of the cavity, a step of connecting electrodes of the surface acoustic wave element to lead members disposed around the cavity member; and a step of sealing the surface acoustic wave elements, cavity members and junctions to the lead members by a mass of resin.

DETAILED DESCRIPTION

Figure 2:
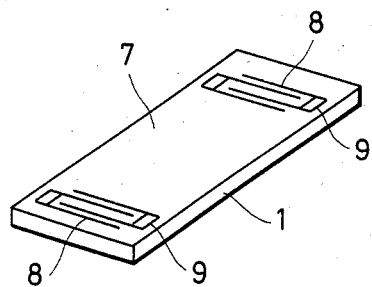
FIG. 2 is a schematic perspective view of a surface acoustic wave element used in the invention.
Figure 3:
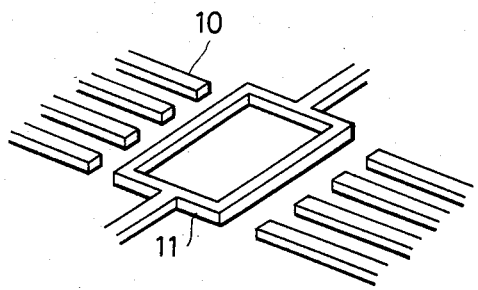
FIG. 3 is a perspective view of a cavity member and lead members used in the invention method.
Figure 4:
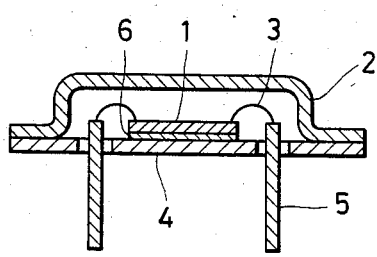
FIG. 4 is a cross-sectional view of a prior art hermetic can package.

The invention is hereinbelow described in detail, referring to a preferred embodiment illustrated in FIGS. 1 through 3. In these drawings, reference numerals 1 through 6 designate identical or corresponding members to those of FIG. 4, reference numeral 7 refers to the wave propagation surface of the surface acoustic wave chip 1, 8 to a comb-shaped electrodes of the chip 1, 9 to electrode pads of the chip 1, 10 to lead members, 11 to a cavity member, and 12 to a mass of resin.

Figure 1:
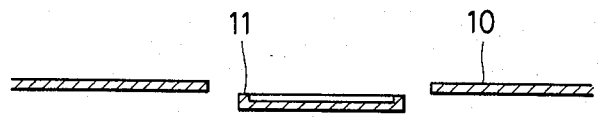
FIG. 1 are cross-sectional views in different steps of a surface acoustic wave device sealing method embodying the invention.
Figure 1:
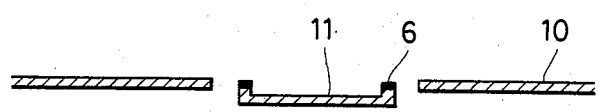
Figure 1:
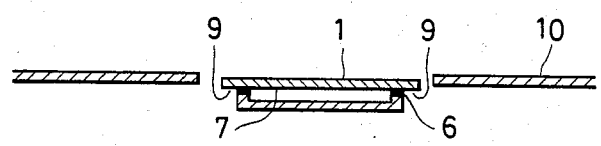
Figure 1:
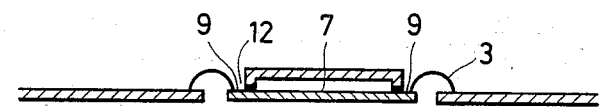
Figure 1:
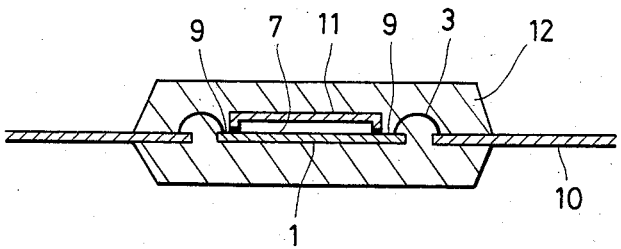

Referring to FIG. 1 which shows different steps of the invention method, the sealing process is explained hereinbelow.

In the first step (a), a cavity member 11 and lead members 10 are prepared. The cavity member 11 defines a widely, upwardly opening cavity.

In the second step (b), an adhesive 6 is applied to the circumferential edge of the cavity member 11 at the open end of the cavity.

In the third step (c), the surface acoustic wave chip 1 is put on the adhesive 6 and is bonded to the cavity member 11 so that the wave propagation surface 7 of the chip faces downward and contacts the adhesive 6. As the result, a sealed interior space is defined by the propagation surface 7, cavity member 11 and adhesive 6. The electrode pads 9 of the chip 1, however, and exposed to the exterior of the cavity member 11.

In the step (d), after the entire structure is inverted, the exposed electrode pads 9 are connected to the lead members 10 by a known wire bonding method.

In the step (e), the substantially entire structure including the chip 1, cavity member 11 and bonding wires 3 is sealed by a mass of resin by a known resin sealing method. In this case, the resin never flows on to the propagation surface 7 which is in the reliably sealed interior space of the cavity of the cavity member.

If the electrode pads 9 are provided on the opposite surface of the chip 1 other than the wave propagation surface 7, it is not necessary to invert the lead frame in the step (c) prior to the wire bonding.

As described, the invention provides a surface acoustic wave device sealing method which uses similar materials to those used in IC resin sealing and is hence much less expensive than the prior art method using a metal or ceramic package.

What is claimed is:

1. A surface acoustic wave device sealing method comprising:
    preparing a cavity member defining a widely opening cavity and originally disposed so that said cavity opens upward;
    bonding a surface acoustic wave element on the open end of said cavity member, said element having a wave propagation surface opposed to the interior of said cavity of the cavity member and electrodes exposed to the exterior of said cavity;
    connecting said electrodes of the surface acoustic wave element to lead members disposed around said cavity member; and
    sealing the substantially entire structure including said element and juctions to the lead members by a mass of resin.

* * * * *